United States Patent
Iorga

(10) Patent No.: US 12,166,485 B2
(45) Date of Patent: Dec. 10, 2024

(54) METHODS AND CIRCUITS FOR SLEW-RATE CALIBRATION

(71) Applicant: Rambus Inc., San Jose, CA (US)

(72) Inventor: Cosmin Iorga, Westlake Village, CA (US)

(73) Assignee: Rambus Inc., San Jose, CA (US)

( * ) Notice: Subject to any disclaimer, the term of this patent is extended or adjusted under 35 U.S.C. 154(b) by 191 days.

(21) Appl. No.: 17/898,800

(22) Filed: Aug. 30, 2022

(65) Prior Publication Data

US 2023/0080033 A1 Mar. 16, 2023

Related U.S. Application Data

(60) Provisional application No. 63/243,283, filed on Sep. 13, 2021.

(51) Int. Cl.
| | |
|---|---|
| *H03L 7/00* | (2006.01) |
| *G11C 7/22* | (2006.01) |
| *H03K 3/0232* | (2006.01) |
| *H03K 19/17784* | (2020.01) |
| *H03L 7/081* | (2006.01) |
| *H03L 7/099* | (2006.01) |
| *H03L 7/195* | (2006.01) |

(52) U.S. Cl.
CPC ............ *H03K 3/0232* (2013.01); *G11C 7/22* (2013.01); *H03K 19/17784* (2013.01); *H03L 7/0818* (2013.01); *H03L 7/0991* (2013.01); *H03L 7/195* (2013.01)

(58) Field of Classification Search
CPC .. G11C 7/22; H03K 3/0232; H03K 19/17784; H03L 7/0818; H03L 7/0991; H03L 7/195
See application file for complete search history.

(56) References Cited

U.S. PATENT DOCUMENTS

| | | | |
|---|---|---|---|
| 5,795,068 A | 8/1998 | Conn, Jr. | |
| 6,011,749 A * | 1/2000 | Roth | ............. G11C 7/22 |
| | | | 365/194 |
| 6,047,346 A | 4/2000 | Lau et al. | |
| 6,437,597 B1 | 8/2002 | Chan | |
| 6,617,895 B2 | 9/2003 | Zumkehr et al. | |
| 6,831,473 B2 | 12/2004 | Iorga | |
| 6,862,548 B1 | 3/2005 | Chan | |
| 6,993,109 B2 * | 1/2006 | Lee | ............. H03L 7/0805 |
| | | | 327/158 |

(Continued)

OTHER PUBLICATIONS

Iorga, "Method for Troubleshooting Power Integrity Problems in Programmable Logic Device Electronic Systems by Embedded Measurement of Power Distribution Impedance," DesignCon 2012, 14 pages.

(Continued)

*Primary Examiner* — Kurtis R Bahr
(74) *Attorney, Agent, or Firm* — Silicon Edge Law Group LLP; Arthur J. Behiel

(57) ABSTRACT

Described is an integrated circuit with a driving amplifier that transmits a signal over a link (e.g. a wire) by raising and lowering a voltage on the link. A reference oscillator provides an error measure for the rate at which the voltage transitions between voltages, the slew rate. Slew-rate calibration circuitry adjusts the driving amplifier responsive to the error measure.

18 Claims, 5 Drawing Sheets

(56) References Cited

U.S. PATENT DOCUMENTS

| | | | |
|---|---|---|---|
| 7,288,958 B2 | 10/2007 | Takagi | |
| 7,308,048 B2 | 12/2007 | Wei | |
| 7,929,357 B2 | 4/2011 | Jeon | |
| 7,969,197 B2 * | 6/2011 | Muraoka | H03K 19/018521 326/86 |
| 8,692,600 B1 | 4/2014 | Blanco et al. | |
| 9,484,891 B2 | 11/2016 | Amirkhany et al. | |
| 9,537,475 B1 | 1/2017 | Iorga | |
| 9,548,726 B1 | 1/2017 | Iorga et al. | |
| 9,564,909 B1 | 2/2017 | Iorga et al. | |
| 9,571,077 B1 | 2/2017 | Iorga et al. | |
| 9,590,797 B1 | 3/2017 | Brown et al. | |
| 9,673,972 B2 | 6/2017 | Gorecki et al. | |
| 2004/0251936 A1 * | 12/2004 | Gomm | H03L 7/0818 327/141 |
| 2012/0146687 A1 * | 6/2012 | Kim | H03K 19/0005 326/30 |

OTHER PUBLICATIONS

Iorga, "Experimental Optimization of Decoupling Capacitors in FPGA Designs by On-Die Measurement of Power Distribution Impedance Frequency Profile," DesignCon 2012, 17 pages.

Iorga, "Measurement, Suppression, and Prediction of Digital Switching Noise Coupling in Mixed-Signal System-On-Chip Applications," PhD dissertation, Stanford University 2007, 153 pages.

* cited by examiner

METHODS AND CIRCUITS FOR SLEW-RATE CALIBRATION

TECHNICAL FIELD

The subject matter presented herein relates generally to high-speed electronic signaling.

BACKGROUND

Personal computers, workstations, and servers are general-purpose devices that can be programmed to automatically carry out arithmetic or logical operations. These devices include at least one processor, such as a central processing unit (CPU), and some form of memory system. The processor executes instructions and manipulates data stored in the memory.

Memory systems commonly include a memory controller that communicates with some number of memory modules via multi-wire physical connections called "channels." Each memory module commonly includes dynamic random-access memory (DRAM) components mounted on a printed circuit board. Successive generations of DRAM components have benefitted from steadily shrinking lithographic feature sizes. Storage capacity and signaling rates within DRAM components have improved as a result. Signaling rates between the memory controller and the DRAM components must improve to take full advantage of these improvements.

Memory modules have been provided with buffer chips disposed between the memory controller and the memory components. The buffer chip separately optimizes the controller and memory interfaces. So-called "data buffers" buffer data communicated from and to the memory controller. A separate address-buffer component, also called a "registering clock driver" (RCD) is used to convey command, address, and clock signals from the controller to each memory component. The RCD has multiple clock transmitters, each transmitting a clock signal—a timing reference that periodically transitions between voltage levels—to multiple memory components over a transmission line. The RCD also has multiple command/address transmitters that each convey command and address signals over a respective transmission line. The RCD transmitters and memory components present impedance discontinuities on the transmission lines, discontinuities that generate signal reflections that distort signals and produce errors. The magnitude of the signal reflections, and thus the errors, for a given signal depends on the signal's slew rate, which is to say the speed at which the signal changes between voltage levels. Slew rates can be adjusted to reduce errors but the methods and circuits used to calibrate slew rate are inadequate for clocking and signal transmission at very high frequencies.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 details an embodiment of pull-up multiphase generator 215 of FIG. 2. The other multiphase generators can be similar.

DETAILED DESCRIPTION

Figure 1:
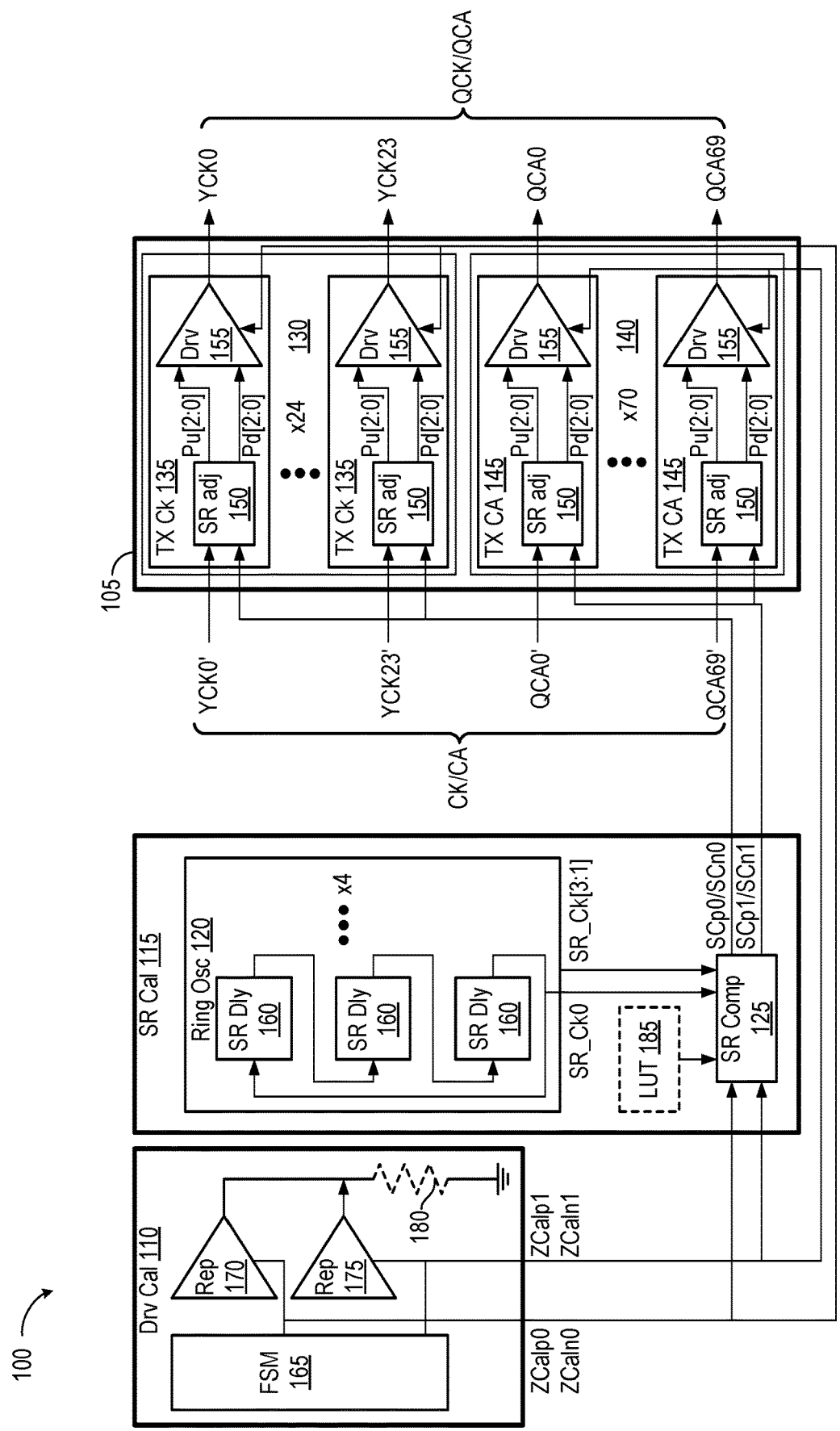
FIG. 1 depicts an integrated circuit (IC) 100 with a multi-link driving amplifier (driver) 105 capable of transmitting twenty-four clock signals YCK[23:0] and seventy command-and-address signals QCA[69:0].

FIG. 1 depicts an integrated circuit (IC) 100 with a multi-link driving amplifier (driver) 105 capable of transmitting twenty-four clock signals YCK[23:0] and seventy command-and-address signals QCA[69:0]. These signals, each either single-ended or differential, express binary values by transitioning between relatively high and low voltages. Driver-calibration circuitry 110 and slew-rate (SR) calibration circuitry 115 control multi-link driver 105 to manage the slew rate for each signal. SR calibration circuitry 115 includes a ring oscillator 120 that issues four reference clock signals SR_Ck[3:0] to respective calibration input nodes of SR computation circuitry 125, the frequencies of which signals provide measures of SR calibration for driver 105. SR computation circuitry 125 computes SR calibration signals SCp0, SCn0, SCp1, and SCn1 from those frequencies and impedance-calibration signals ZCalp0, ZCaln0, ZCalp1, and ZCaln1 from driver-calibration circuitry 115.

Multi-link driver 105 includes two sets of transmitters, a first set 130 of twenty-four clock transmitters 135 and a second set 140 of seventy command-and-address (CA) transmitters 145. Transmitters 135 and 145 drive different loads and are thus sized differently. They can be physically different but are assumed to be similar for ease of illustration, each including SR adjustment circuitry 150 sending three pull-up signals Pu[2:0] and three pull-down signals Pd[2:0] to input nodes of a driver amplifier, or "driver," 155.

With reference to the uppermost clock transmitter 135, SR adjustment circuitry 150 receives a clock signal YCK0' and, from calibration output nodes of SR computation circuitry 125, a pair of SR calibration codes SCp0 and SCn0. SR adjustment circuitry 150 issues three delayed instances of signal YCK0' as pull-up signals Pu[2:0], which stimulate driver 155 to pull output signal YCK0 up toward its relatively high voltage. Three delayed versions of signal YCK0', pull-down signals Pd[2:0], likewise pull output signal YCK0 down toward its relatively low voltage. The phases of signals Pu[2:0] are offset from one another, and the offsets can be adjusted to change the slew rate of rising edges of transmitted signal YCK0. The phases of signals Pd[2:0] can likewise be adjusted to change the slew rate of falling edges.

Signals SCp0 and SCn0 from SR calibration circuitry 115 control the phase offsets for signals Pu[2:0] and Pd[2:0] in transmitters 135, while signals SCp1 and SCn1 do the same for transmitters 145. SR computation circuitry 125 computes the values for signals SCp0, SCn0, SCp1, and SCn1 using four separate oscillators within oscillator 120, one ring oscillator each for the pull-up and pull-down adjustments in sets 130 and 140 of the transmitters. The one ring depicted includes three SR delay elements 160 that are laid out to replicate the timing behavior of a pull-up multiphase generator within each instance of SR adjustment circuitry 150 in clock transmitters 135. The details of how this is done are discussed below. The frequencies of signals SR_Ck[3:0] are functions of the phase offsets between pull-up and pull-down signals in SR adjustment circuitry 150 in each of transmitters 135 and 145.

SR computation circuitry 125 also employs signals from driver-calibration block 110 to compute SR calibration signals SCp0/SCn0 and SCp1/SCn1. Block 110 includes a finite-state machine (FSM) 165, a pair of replica drivers 170 and 175, and a reference impedance 180. Impedance 180 is depicted using dashed lines to emphasize that it is not integrated with IC 100 but is rather an external 240-ohm reference resistor in this example. Recalling that the drivers 155 in transmitters 135 are different from those of transmitters 145, and are thus calibrated separately, replica drivers 170 and 175 are replicas of drivers 155 in transmitters 135 and 145, respectively. Replica circuits are generally formed on the same IC as the circuits they replicate and operate under the same or similar parameters. Process variables that lead to performance differences between ICs tend to cancel, as do the impacts of shared supply voltages and temperature. Replica circuits need not be identical to the circuits they replicate so long as their performance varies predictably with process, voltage, and temperature.

FSM 165 executes a calibration sequence that sets the output impedance, or driver impedance, of each of replica drivers 170 and 175 to match that of impedance 180. Each driver 170 and 175 has pull-up and pull-down elements so there are four driver-calibration codes, signals ZCalp0 and ZCaln0 for calibrating drivers 155 in transmitters 135, and signals ZCalp1 and ZCaln1 for calibrating drivers 155 in transmitters 145. These driver-calibration codes are also conveyed to SR computation circuitry 125 to address the impact of output-impedance calibration on slew rate. An optional look-up table (LUT) 185 provides SR computation circuitry 125 with mode settings in support of e.g. selectable drive strengths, or drive powers, for transmitters 135 and 145. The impact of drive strength on slew rates and the related manner of calibration are discussed below in connection with FIG. 4.

Figure 2A:
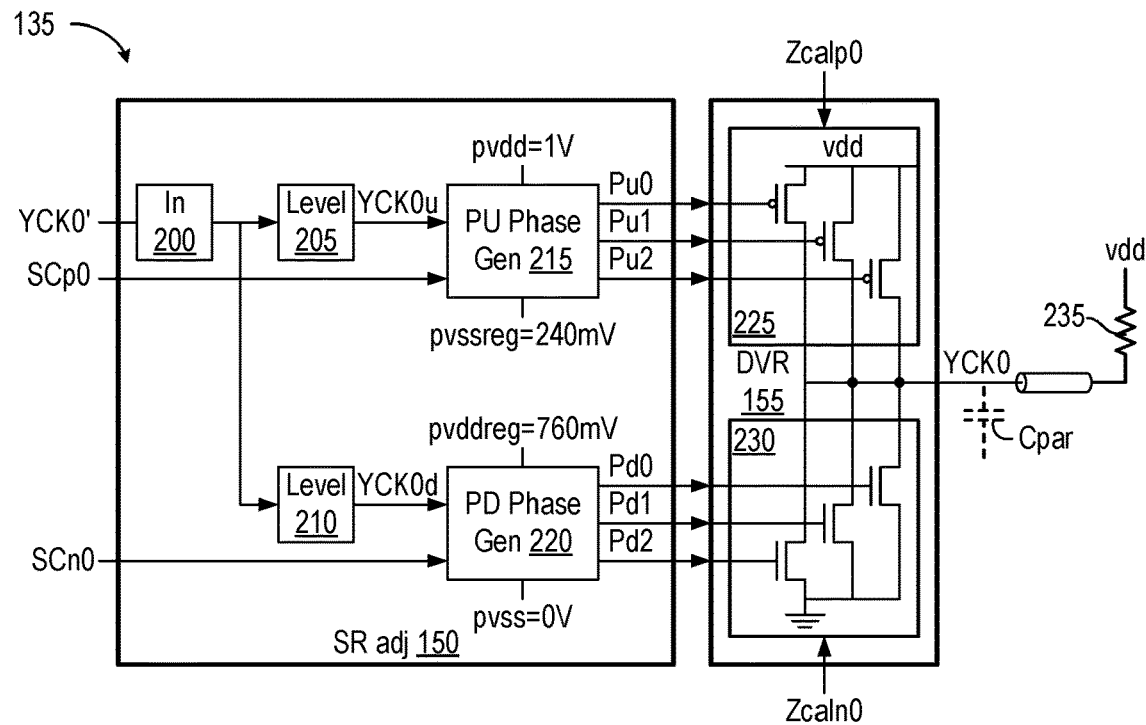
FIG. 2A depicts a single instance of transmitter 135, the functional equivalent to one of transmitters 145.

FIG. 2A depicts a single instance of transmitter 135, the functional equivalent to one of transmitters 145. SR adjustment circuit 150 includes an input amplifier 200, a pair of level shifters 205 and 210, a pull-up multiphase generator 215, and a pull-down multiphase generator 220. Driver 155 is divided into a pull-up drive element 225 and a pull-down drive element 230. Drive elements 225 and 230 are simplified to provide a functional description; practical drivers are more complex and are well understood by those of skill in the art. Also well known, parasitic capacitances Cpar on the output node and elsewhere vary and impact the slew rates of output signals, clock signal YCK0 in this instance. The signal link from driver 155 terminates to a supply node vdd via a load resistor 235. The link and load impedance also impact the SR of signal YCK0.

Beginning with input node YCK0' and like-identified signal, input amplifier 200 amplifies signal YCK0' and conveys its output to level shifters 205 and 210, which shift the voltage ranges of the input signal to accommodate the input requirements of respective phase-generators 215 and 220. The shifted input signal YCK0$u$ drives pull-up multi-phase generator 215, which draws from supply nodes at 1V and 240 mV; the shifted input signal YCK0$d$ drives pull-down multiphase generator 220, which draws from supply nodes at 760 mV and 0V. Pull-up multiphase generator 215, responsive to each rising edge of signal YCK0$u$, pulls each signal Pu1, Pu1, and Pu2 down in succession, thus turning on each corresponding transistor within pull-up drive element 225 in succession. Output signal YCK0 is pulled up toward supply voltage vdd as a result.

SR calibration signal SCp0 sets the phase offsets between signals Pu0, Pu1, and Pu2. These phase offsets determine how quickly the transistors are recruited in pulling up the output node, and consequently impact the slew rate of rising edges of signal YCK0. The pull-down aspect of transmitter 135 works similarly. Pull-down multiphase generator 220, responsive to each falling edge of signal YCK0$d$, pulls each signal Pd0, Pd1, and Pd2 up in succession, thus turning on each corresponding transistor within pull-down drive element 230 in succession. Output signal YCK0 is pulled down toward ground potential (0V) as a result. Calibration signal SCn0 sets the phase offsets between signals Pd0, Pd1, and Pd2, which determine how quickly the transistors are recruited in pulling down the output node, and consequently impact the slew rate of falling edges of signal YCK0.

Figure 2B:
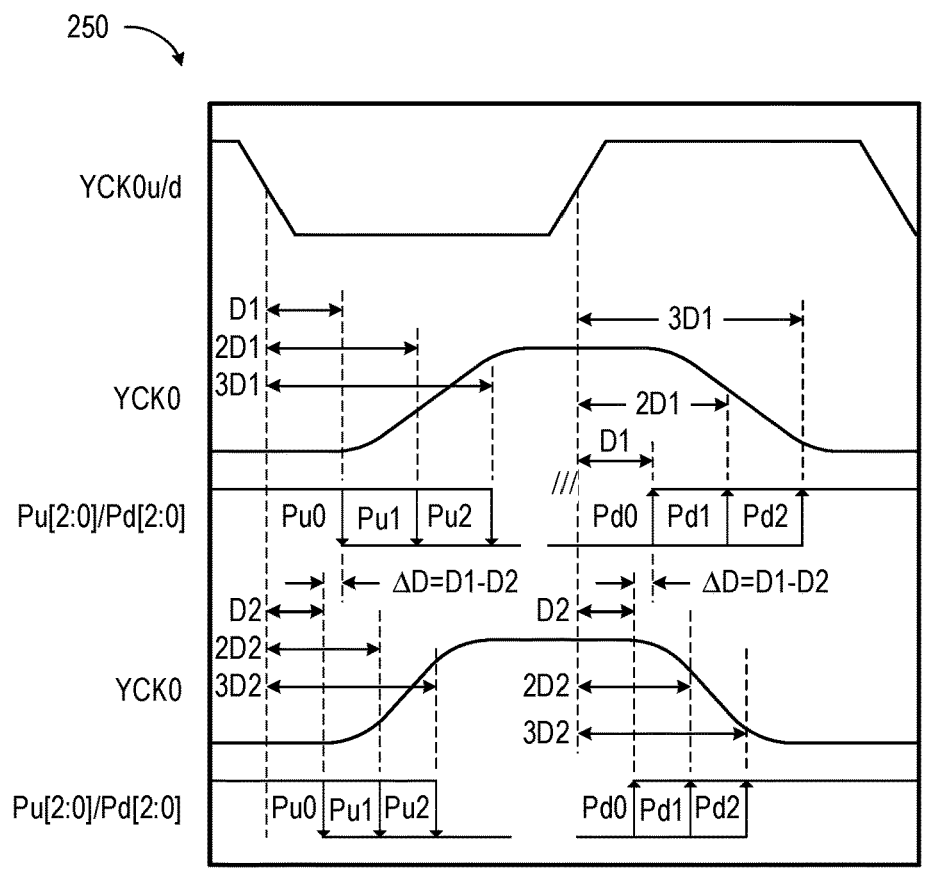
FIG. 2B is a waveform diagram 250 illustrating how phase offsets between edges of signals Pu[2:0] impact the SR of rising edge of output signal YCK0 and phase offsets between edges of signal Pd[2:0] impact the SR of falling edges of output signal YCK0.

FIG. 2B is a waveform diagram 250 illustrating how phase offsets between edges of signals Pu[2:0] impact the slew rate of rising edge of output signal YCK0 and phase offsets between edges of signal Pd[2:0] impact the slew rate of falling edges of output signal YCK0. Because the focus is on timing, the input signals YCK0$u/d$ are shown together, despite spanning different voltage ranges, and signals Pu[2:0] and Pd[2:0] are overlayed with emphasis on transitions that impact driver 155.

Beginning with the first falling edge of signal YCK0$u/d$ and the uppermost instance of output signal YCK0, pull-up multiphase generator 215 pulls signals Pu[2:0] down in succession. Per the setting of calibration signal SCp0, signals Pu1, Pu1, and Pu2 are delayed by increments of a time D1, respectively D1, 2D1, and 3D1. The rising-edge slew rate of signal YCK0 is a function of time D1. Next, at the first rising edge of signal YCK0$u/d$, pull-down multiphase generator 20 pulls signals Pd[2:0] up in succession, each phase delayed by an increment of D1 under control of signal SCn0. The falling-edge slew rate of signal YCK0 is thus also a function of time D1.

The lowermost instance of output signal YCK0 illustrates the same slew-rate functionality but with calibration signals SCp0 and SCn0 set to reduce the incremental delay from D1 to D2, a difference labeled ΔD. As before, multiphase generators 215 and 220 issue their respective signals in succession, but the reduced phase delay D2 means transistors within driver 155 are recruited more quickly and the slew rates of signal YCK0 are thus reduced. SC calibration signals SCp0 and SCn0 can thus be used to adjust and calibrate the slew rate of output signal YCK0.

Transmitter 135 is single-ended in this embodiment but can also be differential. A differential embodiment can replicate the circuitry of FIG. 2A with inverting level shifters to provide a complementary signal half, an inverted version of output signal YCK0 that can accompany that signal to the signal destination.

Figure 3:
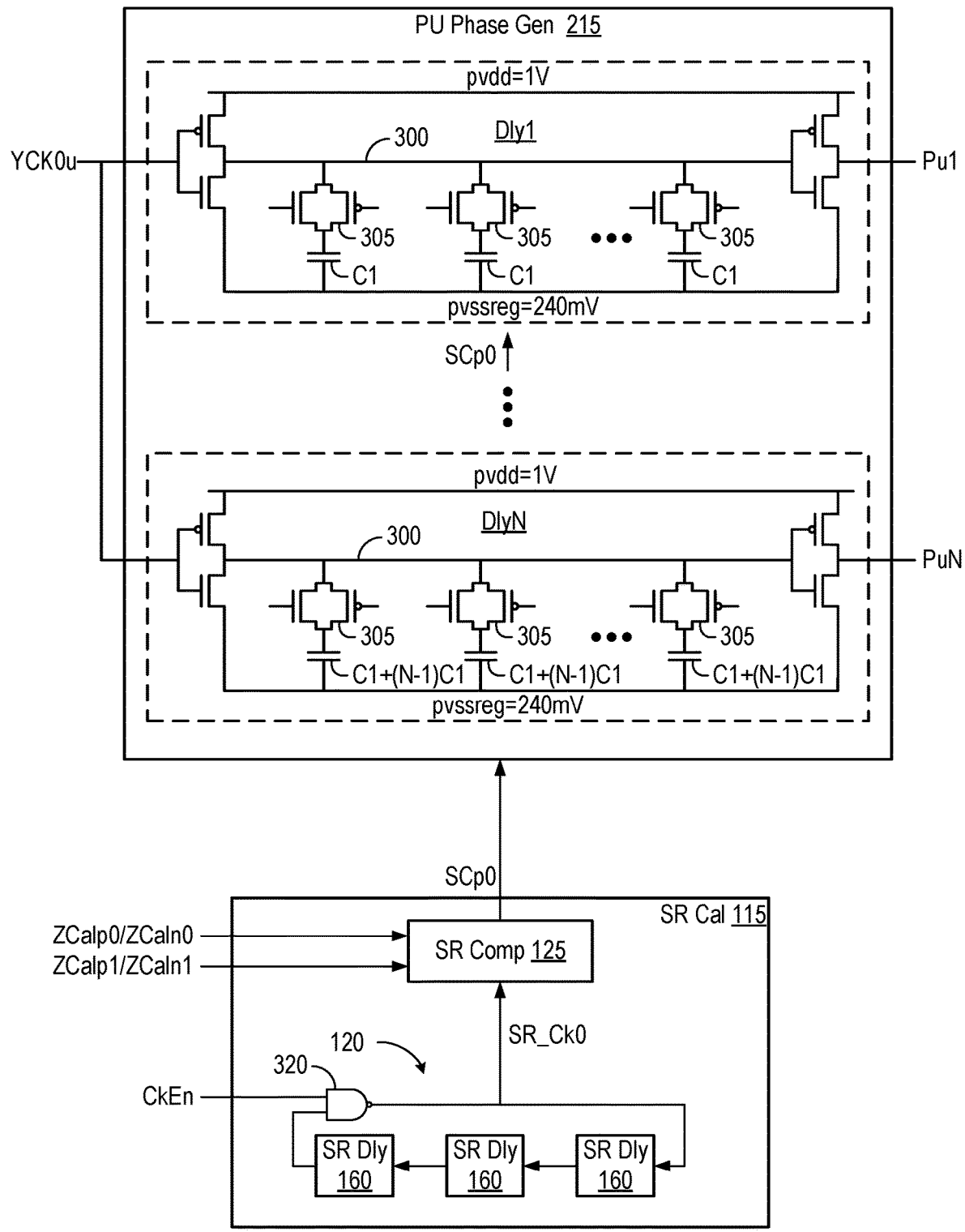

FIG. 3 details an embodiment of pull-up multiphase generator 215 of FIG. 2. The other multiphase generators can be similar. This instance includes N programmable delay elements Dly[N:1], N being three in the foregoing example. Considering delay element Dly1, a pair of CMOS inverters are separated by a signal trace 300 that is coupled to the lower supply voltage via a collection of CMOS pass gates 305 in series with capacitors C1. Control nodes, at the gates of the PMOS and NMOS transistors of pass gates 305, receive binary control inputs from SR calibration signal SCp0. The more pass gates 305 are enabled, the higher the capacitive loading on trace 300 and the longer the delay through delay element Dly1. The remaining delay elements Dly[N:2] exhibit similar behavior responsive to the same calibration signal SCp0, except that the value of the capacitive loading, and therefore the delay, is incrementally increased by the capacitance of capacitors C1 in delay element Dly1. Signal YCK0$u$ is thus replicated as N phase-shifted output signals Pu[N:1].

SR calibration circuitry 115 computes calibration signal SCp0 using driver calibration settings ZCalp0/ZCaln0, the pull-up and pull-down settings for clock drivers 155 in transmitters 135, and the frequency of signal SR_Ck0 from ring oscillator 120. A clock-enable signal CkEn, asserted during calibration, causes an NAND gate 320 to feed the inverted output from one of delay elements 160 back to another. The resultant ring oscillates at a frequency that is a function of the delays through delay elements 160. Each delay element 160 is an instance of element DlyN using the same supply nodes. Being physically and electrically similar, the delay through each element 160 is a similar function of process, voltage, and temperature to the delay through element DlyN. The frequency of signal SR_Ck0 is a function of the delays through elements 160, and therefore element DlyN. The frequency of signal SR_Ck0 thus provides a measure of the incremental delay D1 separating the phases of signals Pu[N:1]. The number of capacitors selected in each delay element 160 can be adjusted to set the oscillation frequency within some functional range of circuitry or instruments employed to measure the frequency.

A second oscillator, not shown, provides a measure of delay D2 for pull-down multiphase generator 220, and a second pair of oscillators provide similar delay measures for pull-up and pull-down drivers in CA transmitters 145 (FIG. 1). The periods of signals SR_Ck[3:0] are merely the inverses of the frequencies so any measure of frequency is also a measure of period, and vice versa.

Figure 4:
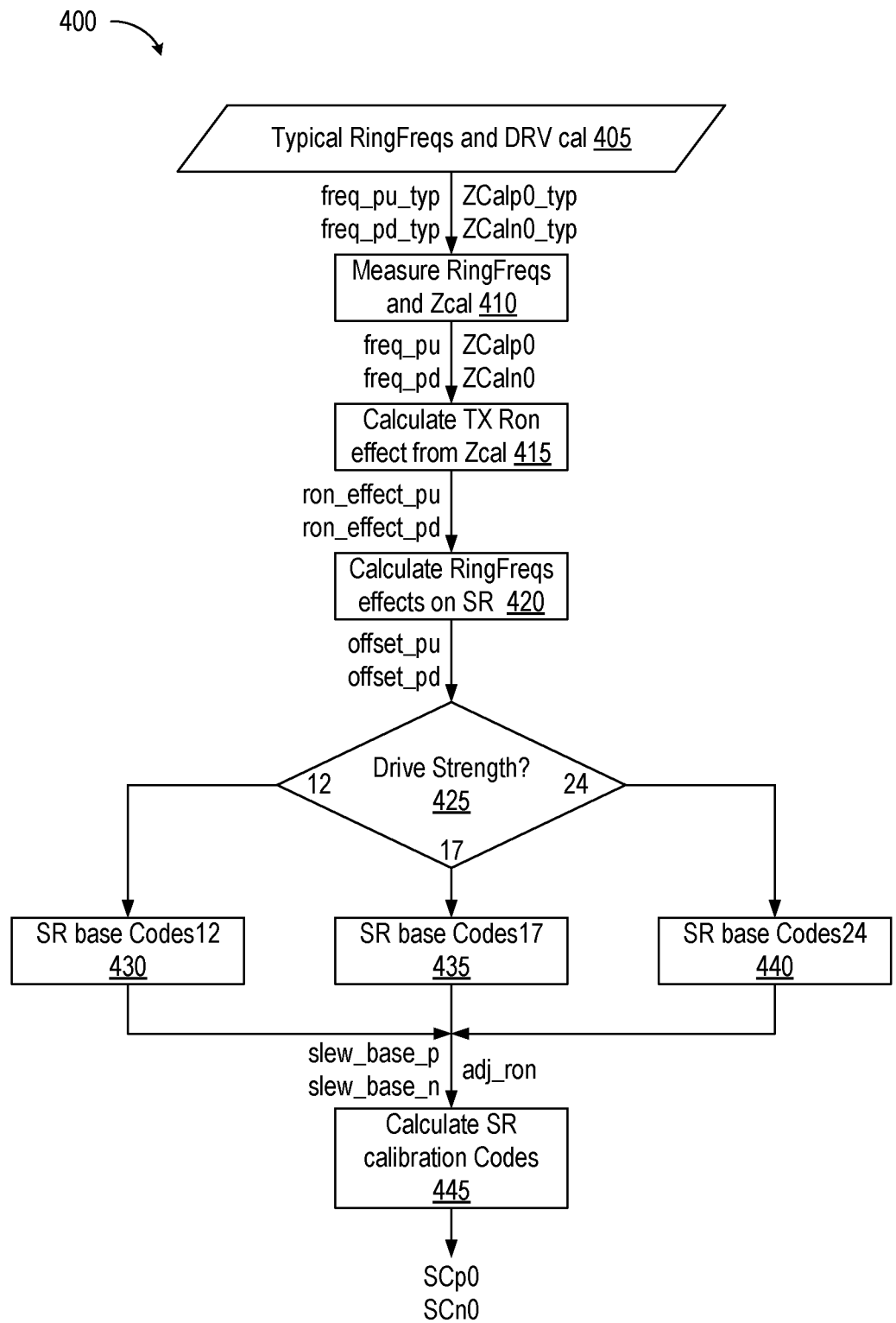
FIG. 4 is a flowchart 400 illustrating a process of SR calibration in accordance with one embodiment.

FIG. 4 is a flowchart 400 illustrating a process of SR calibration in accordance with one embodiment. To begin with, and with reference to IC 100 of FIG. 1, values ZCalp0_typ and ZCaln0_typ, typical values of calibrated driver-control signals ZCalp0 and ZCaln0, are derived by simulation, testing, or a combination of the two. Typical values freq_pu_typ and freq_pd_typ are likewise obtained for the frequencies for signals SR_Ck[1:0] (step 405). These typical values are stored with similar values for the circuitry of CA transmitters 145 and used for reference in calibrating instances of IC 100.

The following discussion describes the calibration process for one of transmitters 135, in particular pull-up multiphase generator 215 and pull-down multiphase generator 220 of FIG. 2A and their respective and associated drive elements 225 and 230. The process for calibrating transmitters 145 is the same or similar and is thus omitted for brevity. Step 410 marks the beginning of a calibration process. Drive strength is calibrated using driver calibration circuitry 110, as described above, and the calibrated values of signals ZCalp0/ZCaln0 and the frequencies freq_pu/freq_pd of ring-oscillator output signals SR_Ck[1:0] are measured and stored. Drive-strength signals ZCalp0 and ZCaln0 control respective drive elements 225 and 230 (FIG. 2). The manner of drive-strength control is not shown in this simplification but is well known.

Next, in step 415, SR computation circuitry 125 calculates values ron_effect_pu and ron_effect_pd, the contributions of the measured values of signals ZCalp0 and ZCaln0 on the slew rates of the signals from the corresponding calibrated driver 155. In one embodiment, this calculation takes the difference between each measured and typical value and scales each result by a factor arrived at for IC 100 either empirically or by simulation, e.g. by dividing each difference by a constant B. Stated mathematically, ron_effect_pu=(ZCaln0−ZCaln0_typ)/B; and ron_effect_pd=(ZCalp0−ZCalp0_typ)/B. In one embodiment, B is five. The resulting values ron_effect_pu and ron_effect_pd for transmitter 135 are stored for use in subsequent computations.

A ring oscillator 120 for each of the four types of pull-up and pull-down circuitry in drive amplifiers 155 provides a measure of slew rate for the corresponding type. Being focused on just one transmitter 135 with its pull-up and pull-down drive elements, in step 420 SR computation circuitry 125 calculates slew-rate offsets for each of drive elements 225 and 230 by comparing the measured frequencies freq_pu and freq_pd of clock signals SR_Ck[1:0] with the typical ones freq_pu_typ and freq_pd_typ from step 405. For each of the two types, SR computation circuitry 125 calculates a slew-rate offset by taking the difference between the measured frequency and the typical frequency and scaling the result by a constant for IC 100, the constant derived either empirically or by simulation, and adding the corresponding drive-strength correction from step 415. In one example, the slew-rate offset_pu for pull-up multiphase generator 215 is calculated as follows: offset_pu=Integer (freq_pu−freq_pu_typ)/A+ron_effect_pu; and the slew-rate offset_pd for pull-down multiphase generator 220 is calculated as offset_pd=Integer(freq_pd−freq_pd_typ)/A+ron_effect_pd, the constant A being e.g. 30.

In some embodiments, SR computation circuitry 125 conveys the calibration values from step 420 to each of the affected drivers. In other embodiments, amplifiers 155 are configurable in a manner that benefits from further calibration. Returning to FIG. 1, for example, each of transmitters 135 and 145 can be one of N parallel slices working together to drive the same signal on the same output node. Drive strength can then be adjusted by enabling all or a subset of those slices. In an embodiment in which N is twenty-four, each transmitter can be programmed as strong (all twenty-four slices enabled), moderate (seventeen slices enabled), or light (twelve slices enabled) by writing configuration values in LUT 185. Enabled slices share the task of transmitting a common signal, so the drive-strength setting can impact the slew rate of each output signal. For this reason, SR computation circuitry 125 reads a register (e.g. LUT 185) that specifies the number of active slices in each driver of the configuration under test (decision 425), branching to one of steps 430, 435, and 440 depending on the number of active slices in a given power mode.

Step 430 assumes twelve active slices in the transmitter 135 used in this illustration. SR computation circuitry 125 reads LUT 185 to receive a pair of base codes BCpu and BCpd for the pull-up and pull-down drive circuitry in the twelve-slice mode. An adjustment adj_ron is then calculated for the mode. In one embodiment, SR computation circuitry 125 calculates adj_ron as follows: adj_ron=Integer(Abs(offset_pu−offset_pd)*(240/RZQ)/12). RZQ is a constant and has a value of e.g. 240 Ohms. Steps 435 and 440 are similar to step 430 except that the denominator changes from twelve to seventeen or twenty-four, respectively. Whichever of step 430, 435, and 440 is selected produces a value adj_ron for use in step 445.

In the final step 445, SR computation circuit 125 calculates pull-up and pull-down skew codes SCp0 and SCn0 using the values slew_base_p, slew_base_n, and adj_ron from the prior step. In one embodiment, slew code SCp0=slew_base_p+offset_pu*adj_ron and slew code SCn0=slew_base_n+offset_pd*adj_ron. These values are passed respectively to PU phase generator 215 and PD multiphase generator 220 to control the slew rates of pull-up and pull-down drive circuitry 225 and 230, and thus of driver 155 and corresponding output signal YCK0.

Figure 5:
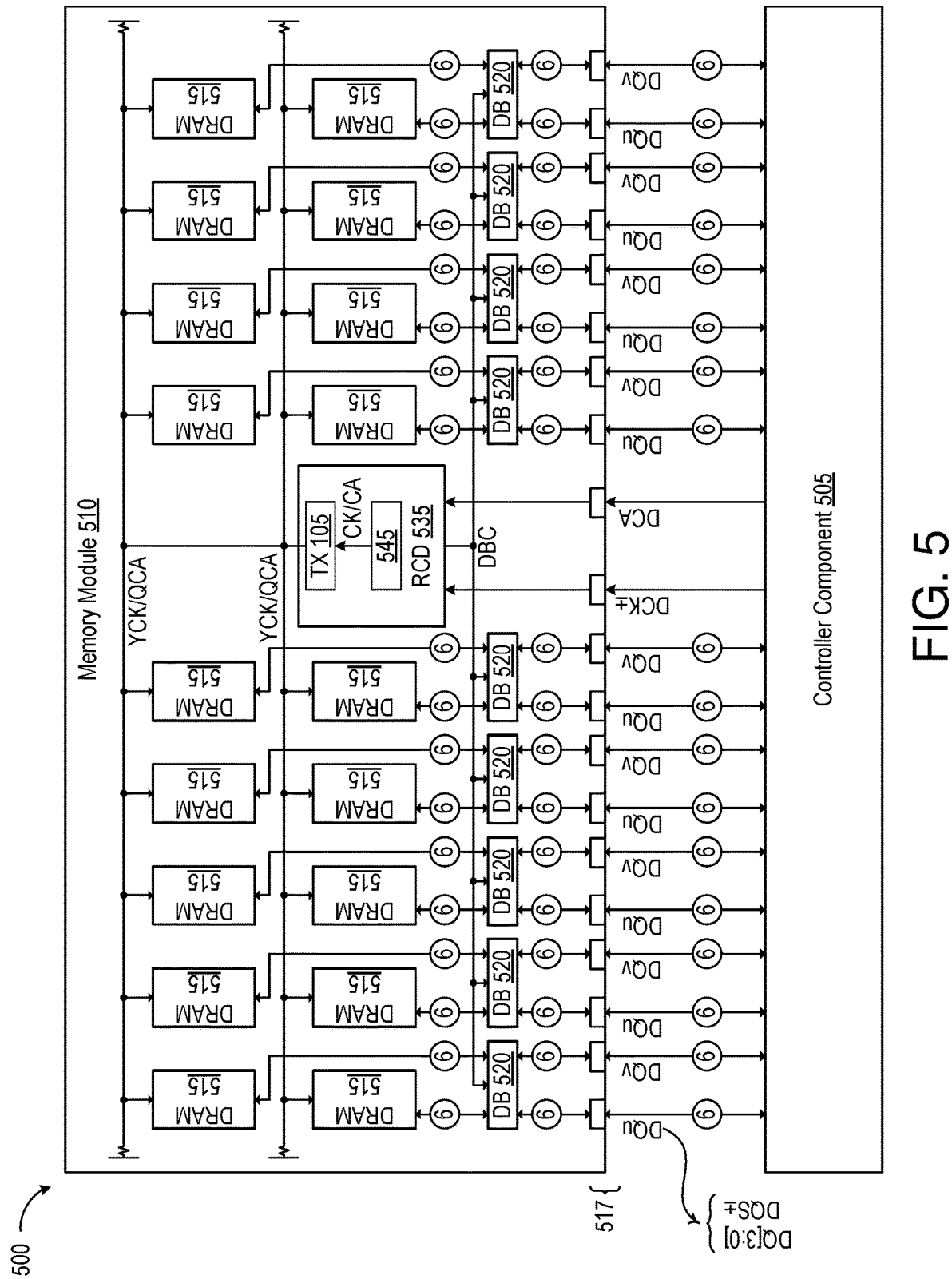
FIG. 5 depicts a memory system 500 incorporating slew-rate calibration circuitry on an address buffer 535 in accordance with one embodiment.

FIG. 5 depicts a memory system 500 in which a controller component 505 issues address and control signals to a memory module 510 to manage the flow of read and write data from and to a collection of memory components 515. Controller component 505 issues complementary strobe signals DQSu± and DQSv± as timing-reference signals that accompany respective parallel, single-ended data signals DQu[3:0] and DQv[3:0] to a module connector 517. Component 505 also provides a shared clock signal DCK±, likewise complementary in this embodiment, as a separate timing reference for command and address signals DCA. A data buffer 520 that manages the communication of data between controller component 505 and memory components 515 includes parallel decision-feedback equalizers (DFEs) for sampling incoming data symbols and adaptive tap-value generators (TVGs) that derive tap values for the DFEs based on the frequency response of the data signal paths. The DFEs forward data and timing signals to memory components 515 via data-buffer core logic. Memory interfaces, optionally including equalization circuitry, manage the flow of read data from memory components 515 to the core logic and, ultimately, to controller component 505.

An address buffer 535 manages the communication of command and address signals between controller component 505 and memory components 515. Address buffer 535 includes logic 545 that interprets signals command-and-address (CA) signals DCA from controller component 505, timed to a complementary clock signal DCK±, to issue clock and CA signals to multi-link driving amplifier 105 (FIG. 1), which responsively issues memory-side clock signals YCK and command/address signals QCA to memory components 515 to manage the flow of read and write data from and two memory components 515. (Driver-calibration circuitry 110 and SR calibration circuitry 115 are also instantiated on RCD 535 but are not shown.) Logic 545 also issues data-buffer control signals DBC that direct the movement of read and write data through data buffers 520. Data buffers 520 and address buffer 535 compensate for signal deterioration using specialized interface circuitry that can otherwise be incorporated into memory components 515 in other embodiments. This interface circuitry can include slew-rate calibration support of the type detailed above.

In the write direction, with the data and address buffers calibrated, controller component 505 directs command, address, and clock signals on primary ports DCA and DCK± to address buffer 535, which responsively issues command and address signals YCK/QCA to memory components 515 and control signals DBC to data buffers 520 to prepare for the receipt of write data. Controller component 505 sends the data to data buffers 520 via two groups of four data links DQu[3:0] and DQv[3:0], each with an accompanying data strobe DQSu± and DQSv±, one link group for each memory component 515. Address-buffer component 535 interprets control signals (e.g., commands, addresses, and chip-select signals) received in parallel on port CA and communicates appropriate command, address, chip-select, and clock signals to memory components 515 (e.g. DRAM packages or dies) via a secondary control interface YCK/QCA. Addresses associated with the commands on primary port DCA identify target collections of memory cells (not shown) in components 515 and chip-select signals associated with the commands allow address-buffer component 535 to select individual integrated-circuit DRAM dies, or "chips," for both access and power-state management.

Data-buffer components 520 and address-buffer component 535 each act as a signal buffer to reduce loading on module connector 517. This reduced loading is in large part because each buffer component presents a single load in lieu of the multiple memory components 515 each buffer component serves. The interfaces between data-buffer components 520 and memory components 515 can include slew-rate calibration support of the type detailed above.

While the present invention has been described in connection with specific embodiments, after reading this disclosure variations of these embodiments will be apparent to those of ordinary skill in the art. For example, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. An integrated circuit (IC) comprising:
an input node to receive an input signal having input-signal transitions;
a multiphase generator coupled to the input node to receive the input-signal, the multiphase generator to issue instances of the input signal, including a first instance of the input signal of a phase offset from a second instance of the input signal;
an oscillator to issue a clock signal of a clock frequency proportional to the phase offset;
calibration circuitry having a calibration input coupled to the oscillator to receive the clock signal and a calibration output coupled to the multiphase generator, the calibration circuitry to adjust the phase offset between the first instance of the input signal and the second instance of the input signal responsive to the clock frequency; and
a driving amplifier having amplifier input nodes coupled to the multiphase generator to receive the instances of the input signal, the driving amplifier to transmit an output signal having output-signal transitions.

2. The IC of claim 1, wherein the input signal and the output signal have symbol rates independent of the clock frequency.

3. The IC of claim 1, further comprising a replica of the driving amplifier calibrated responsive to a driver-calibration code, the calibration circuitry having a second calibration input coupled to the replica to receive the driver-calibration code, the calibration circuitry to adjust the phase offset responsive to the clock frequency and the driver-calibration code.

4. The IC of claim 1, the driving amplifier comprising enabled and disabled driving-amplifier slices, the calibration circuit having a second calibration input to detect a number of the enabled driving-amplifier slices, the calibration circuit to adjust the phase offset responsive to the clock signal and the number of the enabled driving-amplifier slices.

5. The IC of claim 4, wherein the input signal is periodic.

6. The IC of claim 4, further comprising:
a second multiphase generator coupled to the input node to receive the input-signal, the second multiphase generator to issue second instances of the input signal, including a third instance of the input signal of a second phase offset from a fourth instance of the input signal;

a second oscillator to issue a second clock signal of a second clock frequency proportional to the second phase offset; and the calibration circuitry having a second calibration input coupled to the second oscillator to receive the second clock signal and a second calibration output coupled to the second multiphase generator, the calibration circuitry to adjust the second phase offset between the third instance of the input signal and the fourth instance of the input signal responsive to the second clock frequency.

7. The IC of claim 6, further comprising:

a first driving amplifier having first amplifier input nodes coupled to the multiphase generator to receive the instances of the input signal, the driving amplifier to transmit an output signal having output-signal transitions; and a second driving amplifier having second amplifier input nodes coupled to the second multiphase generator to receive the second instances of the input signal, the driving amplifier to transmit a second output signal having second output-signal transitions;

wherein the output signal and the second output signal are complementary.

8. The IC of claim 6, the multiphase generator receiving a first pair of supply voltages and the second multiphase generator receiving a second pair of supply voltage different from the first pair of supply voltages.

9. A method for calibrating a slew rate of an output signal from an amplifier on an integrated circuit, the method comprising:

passing an input signal through a first delay element to produce a first phase-delayed input signal and a second delay element to produce a second phase-delayed input signal;

providing the first phase-delayed input signal and the second phase-delayed input signal to the amplifier, the amplifier to amplify the first phase-delayed input signal and the second phase-delayed input signal on the same output node to produce the output signal, wherein the slew rate of the output signal is a function of a delay between the first phase-delayed input signal and the second phase-delayed input signal;

measuring a frequency of a signal passing through a replica delay element exhibiting a replica delay proportional to the first delay; and adjusting the delay between the first phase-delayed input signal and the second phase-delayed input signal responsive to the frequency.

10. The method of claim 9, wherein the slew rate is a rising-edge slew rate for rising transitions of the output signal, the method further comprising:

passing the input signal through a third delay element to produce a third phase-delayed input signal and a fourth delay element to produce a fourth phase-delayed input signal;

providing the third phase-delayed input signal and the fourth phase-delayed input signal to the amplifier, the amplifier to amplify the third phase-delayed input signal and the fourth phase-delayed input signal on the same output node to produce the output signal, wherein a falling-edge slew rate of the output signal is a second function of a second delay between the third phase-delayed input signal and the fourth phase-delayed input signal;

measuring a second frequency of a second signal passing through a second replica delay element exhibiting a second replica delay proportional to the second delay; and adjusting the second delay between the third phase-delayed input signal and the fourth phase-delayed input signal responsive to the second frequency.

11. The method of claim 9, wherein the first phase-delayed input signal and the second phase-delayed input signal are two of N phase-delayed input signals, and wherein N is at least three.

12. The method of claim 9, wherein the amplifier exhibits a driver impedance, the method further comprising:

deriving calibration signals for the driver impedance; and adjusting the delay between the first phase-delayed input signal and the second phase-delayed input signal responsive to the calibration signals.

13. The method of claim 9, wherein the amplifier exhibits a drive power, the method further comprising:

storing a power setting for the drive power; and adjusting the delay between the first phase-delayed input signal and the second phase-delayed input signal responsive to the power setting.

14. The method of claim 9, further comprising instantiating the replica delay element on the integrated circuit.

15. The method of claim 9, further comprising disabling the replica delay element on the integrated circuit after the adjusting.

16. An integrated circuit (IC) comprising:

an input node to receive an input signal having input-signal transitions;

means for generating instances of the input signal, including a first instance of the input signal of a phase offset from a second instance of the input signal;

means for generating a clock signal of a clock frequency proportional to the phase offset;

means for adjusting the phase offset between the first instance of the input signal and the second instance of the input signal responsive to the clock frequency; and a driving amplifier having amplifier input nodes coupled to the means for generating instances of the input signal, the driving amplifier to transmit an output signal having output-signal transitions responsive to the instances of the input signal.

17. The IC of claim 16, wherein the input signal and the output signal have symbol rates independent of the clock frequency.

18. The IC of claim 16, further comprising a replica of the driving amplifier calibrated responsive a driver-calibration code, the means for adjusting the phase offset further responsive to the driver-calibration code.

\* \* \* \* \*